(12) United States Patent
Selvamanickam et al.

(10) Patent No.: US 7,758,699 B2
(45) Date of Patent: Jul. 20, 2010

(54) APPARATUS FOR AND METHOD OF CONTINUOUS HTS TAPE BUFFER LAYER DEPOSITION USING LARGE SCALE ION BEAM ASSISTED DEPOSITION

(75) Inventors: Venkat Selvamanickam, Wynantskill, NY (US); Srinivas Sathiraju, Riverside, OH (US)

(73) Assignee: SuperPower, Inc., Schenectady, NY (US)

( * ) Notice: Subject to any disclaimer, the term of this patent is extended or adjusted under 35 U.S.C. 154(b) by 0 days.

(21) Appl. No.: 10/609,250

(22) Filed: Jun. 26, 2003

(65) Prior Publication Data
US 2004/0261708 A1 Dec. 30, 2004

(51) Int. Cl.
*H01L 21/00* (2006.01)
*C23C 16/00* (2006.01)
*C23C 14/00* (2006.01)

(52) U.S. Cl. .................. 118/718; 118/723 VE; 118/720; 204/298.01; 204/192.1

(58) Field of Classification Search ............ 118/718; 204/192.1, 298.01; 156/345.53
See application file for complete search history.

(56) References Cited

U.S. PATENT DOCUMENTS

| | | |
|---|---|---|
| 4,506,453 A | 3/1985 | Shirley, Jr. et al. |
| 4,925,829 A | 5/1990 | Fujita et al. |
| 5,076,203 A | 12/1991 | Vaidya et al. |
| 5,470,668 A | 11/1995 | Wu et al. |
| 5,846,911 A | 12/1998 | Freyhardt et al. |
| 5,900,391 A | 5/1999 | Sakakibara et al. |
| 5,993,622 A | 11/1999 | Szczyrbowski et al. |
| 6,045,864 A | 4/2000 | Lyons et al. |
| 6,055,446 A | 4/2000 | Kroeger et al. |
| 6,258,472 B1 | 7/2001 | Neumuller et al. |
| 6,667,527 B2 | 12/2003 | Lue et al. |
| 6,825,051 B2 | 11/2004 | AmRhein et al. |
| 7,025,833 B2 | 4/2006 | Madocks |
| 2001/0006042 A1 | 7/2001 | Iijima et al. |
| 2001/0011524 A1 | 8/2001 | Witzman et al. |
| 2001/0033960 A1 | 10/2001 | Cavalca et al. |
| 2002/0144786 A1 | 10/2002 | Chiang et al. |
| 2003/0221853 A1* | 12/2003 | Shiozawa .............. 174/50 |
| 2004/0261707 A1 | 12/2004 | Selvamanickam et al. |

FOREIGN PATENT DOCUMENTS

JP 56-34148 A 4/1981

\* cited by examiner

*Primary Examiner*—Ram N. Kackar
(74) *Attorney, Agent, or Firm*—Larson Newman & Abel, LLP

(57) ABSTRACT

The present invention is a high-throughput ion beam assisted deposition (IBAD) system and method of utilizing such a system that enables continuous deposition of thin films such as the buffer layers of HTS tapes. The present invention includes a spool-to-spool feed system that translates a metal substrate tape through the IBAD system as the desired buffer layers are deposited atop the translating substrate tape using an e-beam evaporator assisted by an ion beam. The system further includes a control and monitor system to monitor and regulate all necessary system parameters. The present invention facilitates deposition of a high-quality film over a large area of translating substrate.

20 Claims, 9 Drawing Sheets

APPARATUS FOR AND METHOD OF CONTINUOUS HTS TAPE BUFFER LAYER DEPOSITION USING LARGE SCALE ION BEAM ASSISTED DEPOSITION

FIELD OF THE INVENTION

The present invention relates to ion beam assisted deposition (IBAD) system and method of utilizing such a system. More specifically, the present invention relates to large-scale ion beam assisted deposition of thin films, such as the buffer layers of high-temperature superconducting (HTS) tapes.

BACKGROUND OF THE INVENTION

Wire forms the basic building block of the world's electric power system, including transformers, transmission and distribution systems, and motors. The discovery of revolutionary HTS compounds in 1986 led to the development of a radically new type of wire for the power industry; this discovery is the most fundamental advance in wire technology in more than a century. However, to date only short samples of the HTS tape used in the manufacture of next-generation HTS wires have been fabricated at high performance levels. In order for HTS technology to become commercially viable for use in the power generation and distribution industry, it will be necessary to develop techniques for continuous, high-throughput production of HTS tape.

IBAD, such as is described in Neumüller et al., U.S. Pat. No. 6,258,472, dated Jul. 10, 2001, and entitled Product Having a Substrate of a Partially Stabilized Zirconium Oxide and a Buffer Layer of a Fully Stabilized Zirconium Oxide, and Process for its Production has shown great promise in creating desirable buffer layer characteristics as a support for a functional layer of a ceramic superconducting material, such as yttrium-barium-copper-oxide (YBCO) atop the buffering layers of yttrium-stabilized zirconia (YSZ) and cerium oxide ($CeO_2$). During IBAD, a vacuum-deposition process that combines physical vapor deposition (PVD) with ion-beam bombardment occurs: a vapor of coating atoms is generated with an electron-beam evaporator and deposited on a substrate. Ions are simultaneously extracted from a plasma and accelerated into the growing PVD film at energies of several hundred to several thousand electronvolts (eV). The ions impart substantial energy to the coating and coating/substrate interface. This achieves the benefits of substrate heating (which generally provides a denser, more uniform film) without significantly heating the substrate material and degrading bulk properties. The ions also interact with the coating atoms, driving them into the substrate and producing a graded material interface, which enhances adhesion. These factors combine to allow the deposition of uniform, adherent, low-stress films of virtually any coating material on most substrates, including the buffer layers of HTS tapes. In addition, concurrent ion beam bombardment of a growing film has been shown to impart biaxial texture. IBAD has been specifically used for this purpose to achieve a high-degree of biaxial texture in materials used as buffer layers for HTS tapes.

While such prior art IBAD processes are well known for their rapid deposition rates, they are also prone to process variations. The high-throughput continuous deposition of buffer layers necessary to enable cost-effective and, consequently, widespread adaptation of HTS materials in the electricity transmission/distribution industry necessitates deposition runs that can take upwards of one week to complete, during which time process variations sufficiently severe to disrupt the process are likely to occur. HTS films are extremely sensitive to such variations in system parameters and conditions such as chamber pressure and temperature. As a result, prior art HTS materials have been successfully fabricated only on a small scale.

It is thus an object of this invention to provide a high-throughput IBAD system and method for its use that enables continuous deposition of high quality thin films such as the buffer layers of HTS tapes.

BRIEF SUMMARY OF THE PRESENT INVENTION

The present invention is a high-throughput IBAD or other deposition system and method of utilizing such a system that enables deposition of thin films such as the buffer layers of HTS tapes on a continuously moving substrate.

The present invention includes a spool-to-spool feed system that translates a metal substrate tape through the IBAD system as the desired buffer layers are deposited atop the translating substrate tape using an e-beam evaporator assisted by an ion beam. The system further includes a control and monitor system to monitor and regulate all necessary system parameters.

The consistency of application of the thin film coating by the use of a cooling block having a minor but important curvature on the surface in contact with the moving substrate. An essential part of the innovative systems resides in the introduction of oxygen through orifices in the contact surface of the cooling block.

DETAILED DESCRIPTION OF THIS INVENTION

Figure 1A:
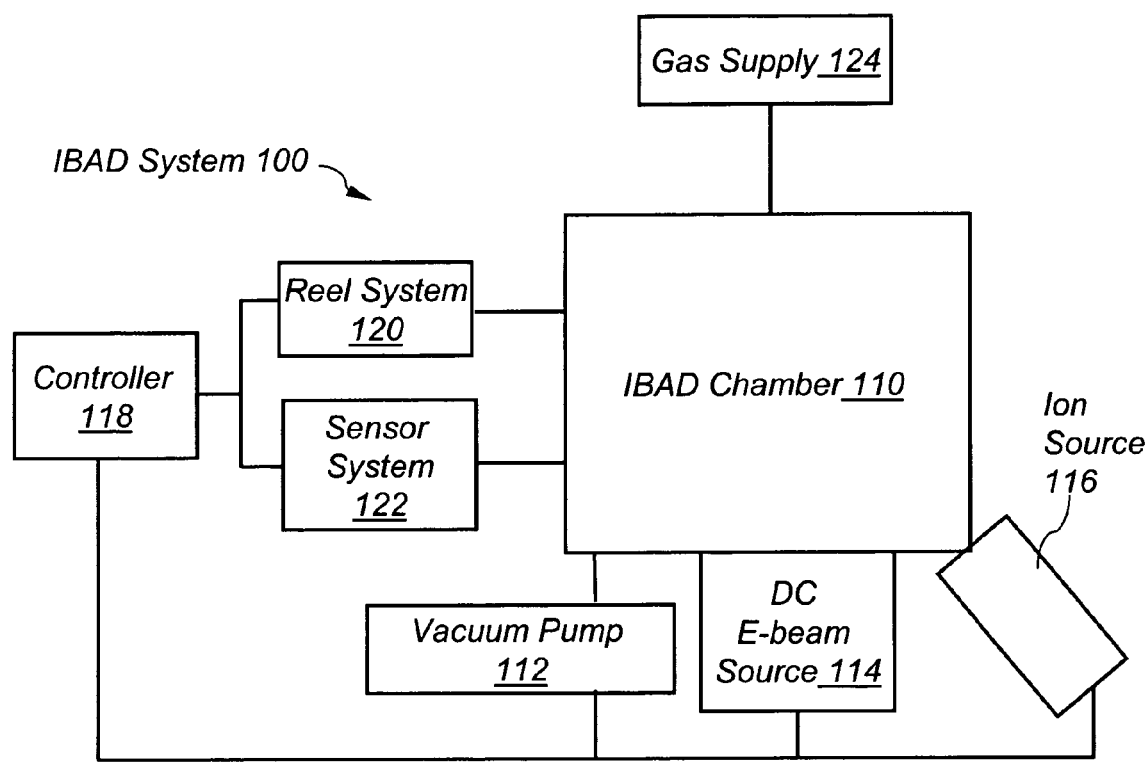
FIG. 1A is a block diagram of the IBAD system of the present invention depicting the functional relationships between the subsystems of the IBAD system.

FIG. 1A illustrates a logical representation of the IBAD system 100 of the present invention in block diagram form, depicting the functional relationships between each subsystem. The IBAD system 100 includes a controller 118 a vacuum pump 112, a DC E-beam source 114, an ion source 116, a reel system 120, a sensor system 122 and a gas supply 124.

The vacuum pump 112 is a commercially available vacuum pump capable of maintaining a vacuum of pressure in the order of magnitude of $10^{-5}$, preferably $10^{-7}$ Torr. One example of such a pump is an APD Cryogenics, [1833 Vultee Street, Allentown, Pa. 18103] Marathon 16 cryopump.

The DC E-beam source 114 is a commercially available electron source having the capabilities to dynamically control the trajectory of the electrons. One example of a commercially available E-beam source is a Thermionics source manufactured by Thermionics Vacuum Products [231 Otto St., Port Townsend, Wash. 98368] and having a power rating of 10 kW watts.

The ion source 116 is a commercially available ion source. One example is a Veeco-Ion Tech, RF 6* 22 linear source, manufactured by Veeco-Ion Tech, Inc. [2330 East Prospect Rd., Fort Collins, Colo. 80525] and using a voltage of 1990 volts and having a power rating of 500 W.

Figure 1B:
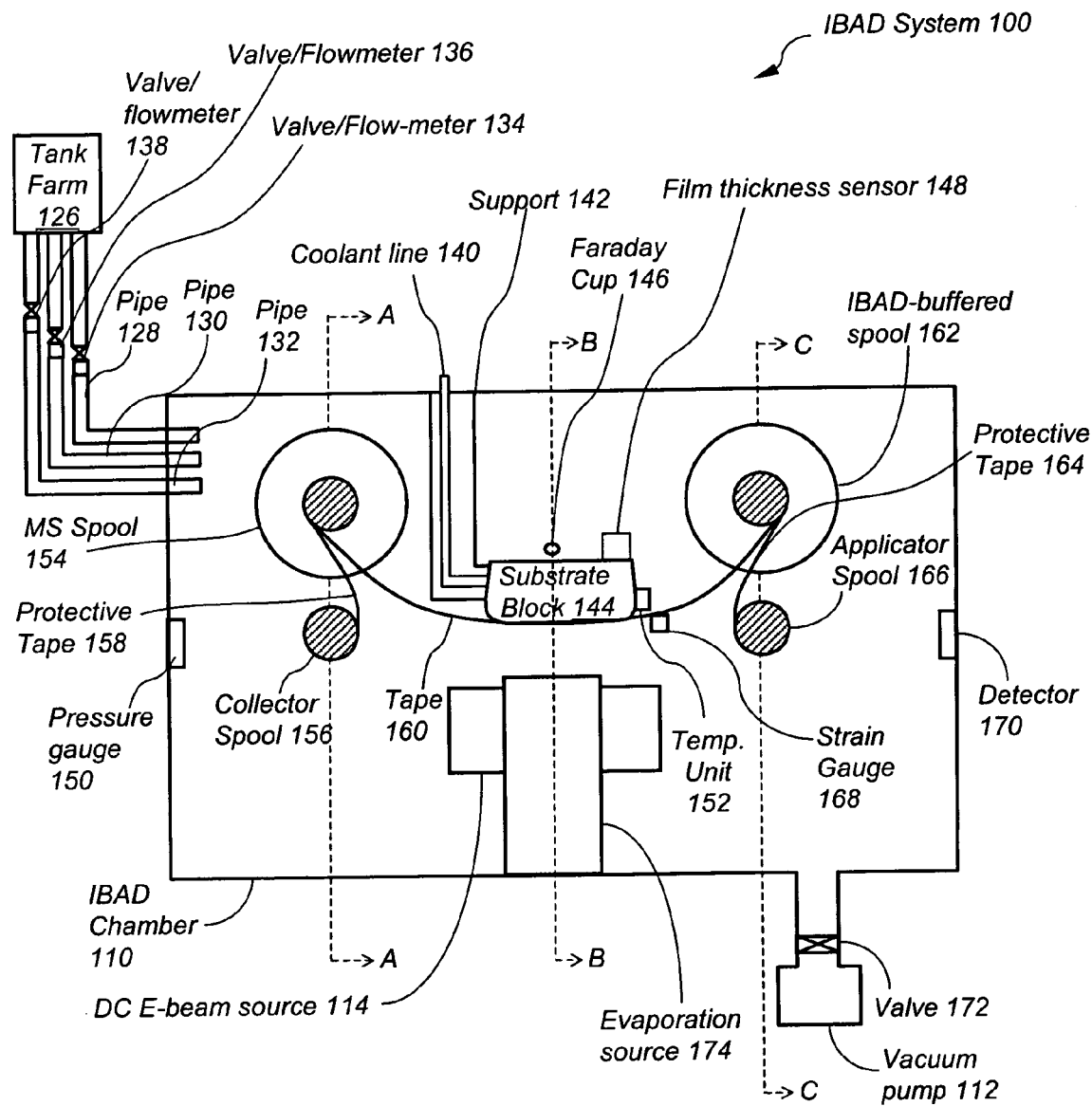
FIG. 1B is a front view of the IBAD system of the present invention.

The controller 118 is a controller with a plurality of inputs and outputs that meet the requirements of the peripherals described in FIG. 1B. The controller 118 may be a microcontroller or a PC with appropriate hardware & software.

The reel system 120 is a tape transport system that serves to translate an extended length of tape through the IBAD system 100 and to take up tape on which an HTS film has been deposited. The reel system 120 is described in FIG. 1B, FIG. 1C, FIG. 1D and FIG. 1E.

The sensor system 122 includes sensors disposed in and around the IBAD chamber that monitor process conditions and parameters of the HTS tape deposition system 100, as described further in FIG. 1B. The sensor system 122 may include a pressure gauge, film thickness sensor, faraday cup, and a temperature-sensing unit, as described below.

The gas supply 124 is a gas injection system that provides gas at a flow rate to meet process specifications stored in the controller 118. Supplied gases may include argon, nitrogen and oxygen. The gas supply 124 is described below in FIG. 1B.

Functional connections exist between the vacuum pump 112, the DC E-beam source 114, the RF ion source 116, the reel system 120, the sensor system 122, the gas supply 124, and the IBAD chamber (described below). Similarly, the controller 118 is electrically coupled to the vacuum pump 112, the DC E-beam source 114, the ion source 116, the reel system 120, the sensor system 122 and the gas supply 124.

FIG. 1B illustrates the IBAD system 100, in accordance with the invention that includes IBAD chamber 110, a tank farm 126, a valve/flowmeter 134, a pipe 128, a valve/flowmeter 136, a pipe 130, a valve/flowmeter 138, a pipe 132, a coolant line 140, a support 142, a substrate block 144, a faraday cup 146, a film thickness sensor 148, a pressure gauge 150, a temperature unit 152, an MS (Metal Substrate) spool 154, a collector spool 156, a protective tape 164, a tape 160, an IBAD-buffered spool 162, a protective tape 158, an applicator spool 166, a strain gauge 168, a detector 170, a valve 172, vacuum pump 112, an evaporation source 174, a gas line 166, and DC E-beam source 114.

The IBAD chamber 110 is a pressurized vacuum chamber. The IBAD chamber 110 may be constructed of any non-corroding metal such as 304 stainless steel. The IBAD Chamber 110 includes all the necessary gaskets, seals and seal plates to maintain a vacuum to the order of $10^{-7}$ Torr.

The pressure gauge 150 is a device capable of accurately measuring pressure ranging from $10^{-9}$ Torr to 1000 Torr such as a Pirani gauge or ionization gauge. The pressure gauge 150 is an element of the sensor system 122.

The tank farm 126 is a series of gas supply tanks and is a part of the gas supply 124 subsystem. Supplied gases may include argon, nitrogen and oxygen.

The valve/flowmeters 134, 136, and 138 are elements of the gas supply 124 subsystem that consist of gas flow units containing electrically controlled gas flow valves along with corresponding flowmeters such as manometers to control/monitor gas flow and partial pressures. Examples of such a valve and flowmeter are MKS 1179 and MKS Baratron respectively manufactured by MKS Instruments, Inc. [789 Grove Rd., Suite 111 Richardson, Tex. 75081].

The pipes 128, 130, and 132 are gas supply lines that are included in the gas supply 124 subsystem. The pipes 128, 130, and 132 may be constructed from a variety of materials such as stainless steel.

The coolant line 140 is a pipe containing a supply line and a return line through which a coolant such as water or a glycol solution is transported. The coolant line 140 may be constructed from any of a number of materials such as stainless steel or copper.

The support 142 is a metal support having appropriate mounting brackets at both longitudinal ends, as well as an internal passageway capable of containing piping and/or wiring. The support 142 may be constructed from stainless steel or any corrosion resistant metal.

The substrate block 144 is a metal, preferably copper, block having an internal coolant passageway loop so as to increase the heat transfer capacity. In an alternative embodiment, the substrate block 144 also includes a gas manifold and internal gas passageways from the manifold, which terminate in multiple orifices located in the bottom of the substrate block.

The use of orifices through which gas is ejected on the backside of the translating substrate has been found to provide a significant convective cooling effect on the substrate, thereby promoting the deposition of a consistent coating layer on the substrate. Any gas at ambient temperature, for example, is useful for this purpose.

In addition to the beneficial cooling effect, when oxygen is utilized as the cooling gas significant additional beneficial results in producing a better textures coating may be obtained. In a series of experiments the effect of oxygen introduced through the substrate block orifices was compared to oxygen introduced into the deposition chamber at other locations. The results demonstrate [FIG. 4] that oxygen introduced into the chamber through the cooling block directly onto the backside of the substrate produces a superior coating.

Further experiments demonstrated that the beneficial effect is responsive to changes in the oxygen flow rate and that the most dramatic effect occurs at about 1 sccm.

It is possible that a higher oxygen partial pressure could be achieved by flowing an increased amount of oxygen in the chamber background. However, that would necessitate increased pumping capacity in order to maintain the same total pressure. Also, where a substrate cooling block of a design similar to that described is used, some other gas will have to be used for convective cooling, further adding load to the vacuum pumps.

Thus, there are two benefits obtained by having the oxygen injected into the deposition chamber through orifices in the cooling block: improved texture and better cooling of the substrate.

It is well known that the substrate tape has to be held flat in the deposition zone. The ion arrival angle has to be maintained close to 55 degrees to the substrate normal in order to achieve good texture. Inclination in the tape is not desired since it affects the ion arrival angle.

It is easy to maintain a stationary substrate flat against a cooling block. However, where the substrate is a moving substrate, it is difficult to maintain good contact on a flat block. It has now been determined that a substrate cooling block with a gentle negative curvature provides increased stability of angle and contact with the moving tape.

It has been determined that the benefits of curvature of the substrate cooling block must be held within a specific range of values to obtain the benefits of increased stability of angle and contact while at the same time minimally affecting the ion arrival angle the at the edges of the substrate block. The specified benefits are obtained when the radius of curvature is in the range of about 2 m to 25 m, preferably from about 3 m to about 15 m and most preferably from about 5 m to about 10 m The substrate block 144 incorporates all necessary mounting holes and coolant connectors. In addition, the substrate block 144 includes a shutter (not shown) that can be opened or closed to expose the deposition zone to the chamber environment. The substrate block 144 is positioned within the IBAD chamber 110 so that a deposition zone for the tape 160 is created at the surface of the substrate block 144.

Figure 3:
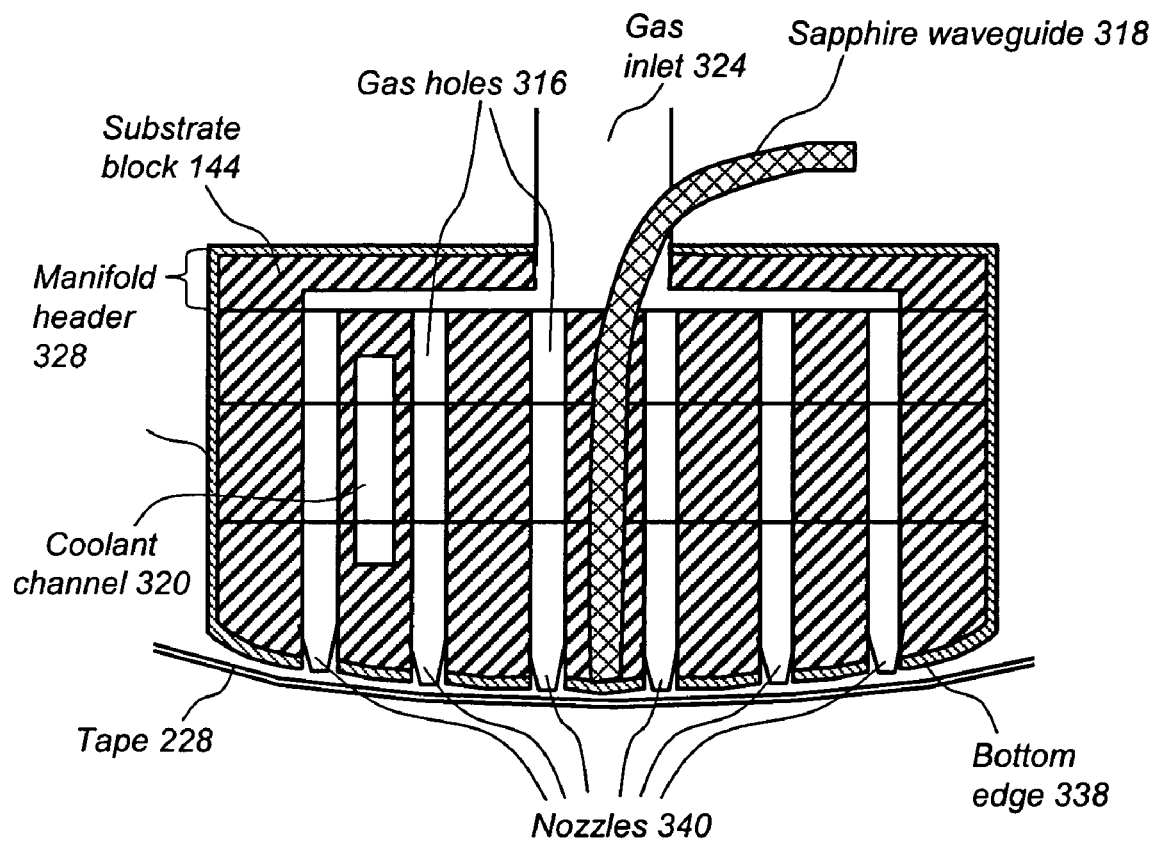
FIG. 3 is a cross sectional view of the substrate block

FIG. 3 is a cross-sectional view of the substrate block 144. This view shows the substrate block 144, through which is disposed a gas inlet 324 (fed by the gas inlet from the tank farm) that branches into multiple rows of multiple gas holes 316, each of which are approximately 0.025 to 0.4 mm, preferably about 0.05 to about 0.25 inches and most preferably is in the range of from about 0.075 to about 0.175 inches in diameter, and terminates in one of a plurality of nozzles 340 disposed through a bottom edge 338 of the substrate block 144. The substrate block 144 is further shown to include a manifold header 328. The manifold header 328 is a metallic, preferably copper, block; a cavity machined in the manifold header 328 covers all the gas holes 316. Each gas hole 316 is drilled completely through the substrate block. The remained of the substrate block may be a unitary structure or it may be built of layers. A liquid coolant channel 320 is machined through the solid substrate block.

As shown in FIG. 1B, faraday cup 146 is a device capable of collecting and detecting ions. It includes a coaxial cable bent at to an angle of 55 degrees, an ion collector plate and a metallic shield/collector. The faraday cup is an element of the sensor system 122.

The film thickness sensor 148 is a quartz crystal with which the film deposition thickness can be monitored through the decrease in the resonant frequency as the film accumulates on the crystal surface. One example of a film thickness gauge is produced by Inoficon, Inc. [Two Technology Place, East Syracuse, N.Y. 13057]. The film thickness sensor 148 is an element of the sensor system 122.

The temperature unit 152 is a temperature-monitoring element included in the sensor system 122. The temperature unit 152 may include a variety of temperature measuring devices such as thermocouples and/or an optical pyrometer.

The MS spool 154 is a spool on which a metal substrate, or the tape 160, is wound. The diameter and width may vary with the dimensions of the desired product. The MS spool 154 may be constructed from a variety of materials capable of withstanding vacuum chamber conditions. The MS spool 154 is an element of the reel system 120.

The collector spool 156 is a spool, similar to the MS spool 154, on which the protective tape 164 is wound. The collector spool 156 may be constructed from a variety of materials capable of withstanding IBAD vacuum chamber conditions. The collector spool 156 is an element of the reel system 120.

The protective tape 158 and the protective tape 164 are polymeric tapes having protective properties such as scratch resistant surfaces. The dimensions of the protective tape 158 and the protective tape 164 correspond to the tape 160, as described below. The protective tape 158 and the protective tape 164 are elements included in the reel system 120.

The tape 160 is a metal tape formed from a variety of metals capable of withstanding temperatures up to 900 C, such as stainless steel or a nickel alloy such as Inconel. The dimensions of the tape 160 may vary to meet the desired finished product and system limitations. For example, the tape 160 may have a thickness of 25 microns, a width of 1 cm and a length of 100 meters.

The IBAD-buffered spool 162 is constructed from similar material and dimensions to the MS spool 154. The IBAD-buffered spool 162 is the spool on which the tape 160 is wound and is an element of the reel system 120.

The applicator spool 166 is of similar material and dimensions to the collector spool 156 and is the spool on which the protective tape 158 is collected. The applicator spool 166 is an element of the reel system 120.

The strain gauge 168 is a device capable of measuring the tension in a tape strung between two points. Such sensors are commercially available from a variety of vendors. The strain gauge 168 is an element of the sensor system 122.

The detector 170 is a device that uses x-ray diffraction capable of monitoring the texture of a HTS substrate and is an element of the sensor system 122.

The valve 172 is a commercially available valve capable of controlling the exit flow of a vacuum chamber. One example of such a valve is a throttle valve produced by MeiVac, Inc. [6292-A San Ignacio Ave., San Jose, Calif. 95119].

The evaporation source 174 is a commercially available deposition source materials such as Yttria-Stabilized Zirconium (YSZ) or Magnesium Oxide (MgO) for exposure to electron bombardment. The evaporation source 174 is a consumable.

The IBAD chamber 110 exists within the IBAD system 100. The pressure gauge 150 is functionally integrated into the IBAD chamber 110, such that a seal is maintained between the pressure gauge 150 and the IBAD chamber 110. The tank farm 126 is functionally and independently connected to the valves 134, 136 and 138. The valves 134, 136 and 138 are in turn functionally connected to the pipes 128, 130 and 132 respectively, which in turn pass into the IBAD chamber 110. Consequently, three separate, sealed gas flow lines are formed between the tank farm 126 and the IBAD chamber 110 by the valve 134 and the pipe 128, the valve 136 and the pipe 130, and the valve 138 and the pipe 132.

The support 142 is fixedly attached to the IBAD chamber 110 and to the substrate block 144. The coolant line 140 travels from a coolant source (not shown) into the IBAD chamber 110, through the support 142 where it functionally connects to the substrate block 144 such that a sealed connection is formed between the coolant line 140 and the substrate block 144. The Faraday cup 146 is mechanically fastened to a surface of the substrate block 144, as described in further detail in FIG. 1C. Similarly, the film thickness sensor 148 is fixedly attached to a surface of the substrate block 144, as described in further detail in FIG. 1C. The temperature unit 152 is fixedly attached to a surface of the substrate block 144.

The MS spool 154 and the collector spool 156 exist inside the IBAD chamber 110 as further described in FIG. 1B. The protective tape 158 is wound on the collector spool 156, from which it spans to the MS spool 154. The protective tape 158 is unwound simultaneously from the tape 160 from the MS spool 154, such that for every unwinding of the tape 160 a layer of protective tape is unwound on to the collector spool 156. The tape 160 spans from the MS spool 154 to where it contacts a surface of the substrate block 144, then contacts the strain gauge 168 and continues to the IBAD-buffered spool 162. The IBAD-buffered spool 162, as well as the applicator spool 166, exist in the IBAD chamber 110 as described in further detail in FIG. 1D. The tape 160 is wound simultaneously with the protective tape 164 onto the IBAD-buffered spool 162, such that for every winding of the tape 160 exists a winding protective tape 164 on top of it. The protective tape 164 then spans from the applicator spool 166 to where it is wound on the IBAD-buffered spool 162.

The detector 170 is functionally integrated into the IBAD chamber 110, such that the detector 170 exists on the vertical level on which the substrate block 144 contacts the tape 160. Similarly, the valve 172 is functionally integrated into the IBAD chamber 110. The valve 172 is then functionally connected to the vacuum pump 112. The evaporation source 174 exists in the IBAD chamber 110 such that its top surface horizontally aligned with the substrate 144. Similarly, the DC E-beam source 114 exists in the IBAD chamber 110 and houses the evaporation source 174 as per the DC E-beam source 114 manufacturer's specifications.

Figure 1C:
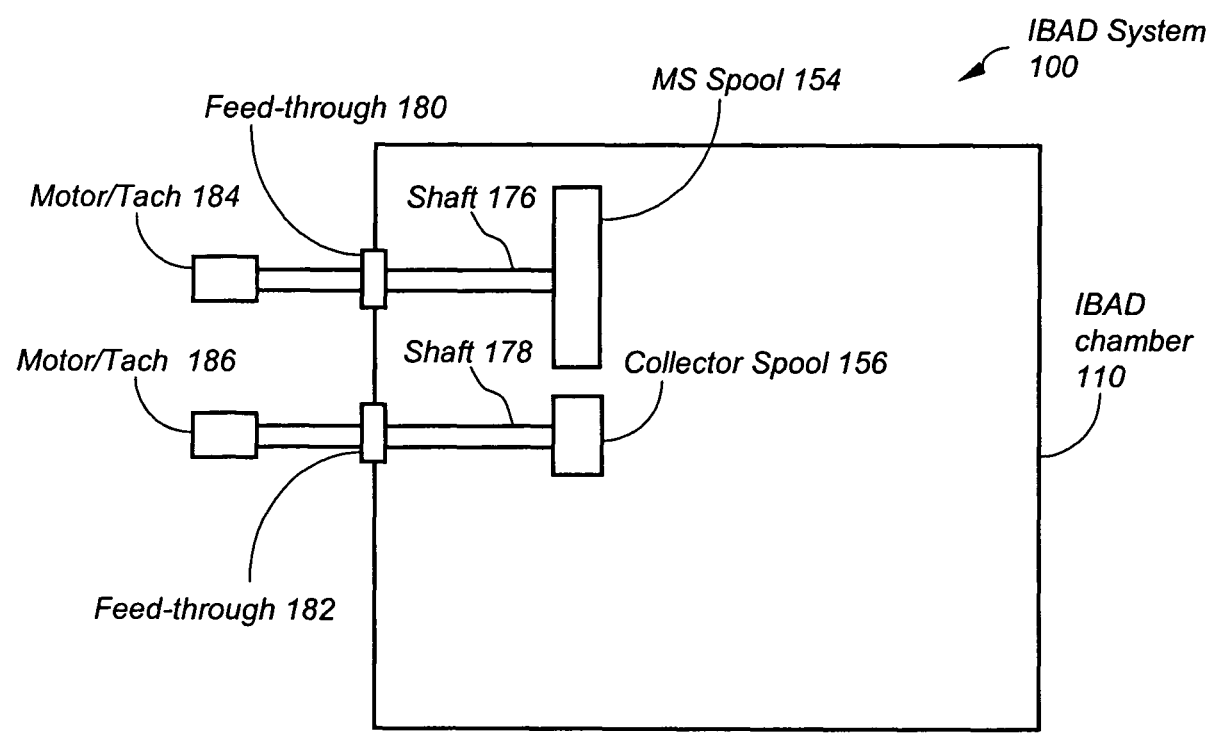
FIG. 1C is a cross-sectional view of the IBAD system taken along line A-A of FIG. 1B.

FIG. 1C illustrates a cross-sectional view of the IBAD system 100 taken along line A-A of FIG. 1B, that includes the IBAD chamber 110, the MS spool 154, the collector spool 156, a shaft 176, a shaft 178, a feed-though 180, a feed-through 182, a motor/tach 184 and a motor/tach 186.

The shaft 176 and the shaft 178 are commercially available drive shafts capable of supporting the loads and stresses of the MS spool 154 and the collector spool 156 respectively. The shaft 176 and the shaft 178 are elements of the reel system 120.

The feed-through 180 and the feed-through 182 are commercially available feed-throughs such as those produced by Ferrofluidics [Ferrotec (USA) Corporation, 40 Simon St., Nashua, N.H. 03060-3075], and are elements of the reel system 120.

The motor/tach 184 and the motor/tach 186 are commercially available motor and tachometer systems capable of translating tape 160 at speeds between 0.1 and 50 meters/hour at an accuracy within +/−1% of the linear speed. The motor/tach 184 and the motor/tach 186 are elements of the reel system 120.

The IBAD chamber 110 exists within the IBAD system 100. The MS spool 154 exists within the IBAD chamber 110. The MS spool 154 is functionally connected to the shaft 176, which passes through the feed-through 180 while still maintaining a vacuum seal. The shaft 176 is then functionally connected to the motor/tach 184. The feed-through 180 is functionally integrated into the IBAD chamber 110, such that a seal is maintained between the feed-through 180 and the IBAD chamber 110. Similarly, the collector spool 156 exists within the IBAD chamber 110. The collector spool 156 is functionally connected to the shaft 178, which passes through the feed-through 182 while still maintaining a vacuum seal. The shaft 178 is then functionally connected to the motor/tach 186. The feed-through 182 is functionally integrated into the IBAD chamber 110, such that a seal is maintained between the feed-through 182 and the IBAD chamber 110.

Figure 1D:
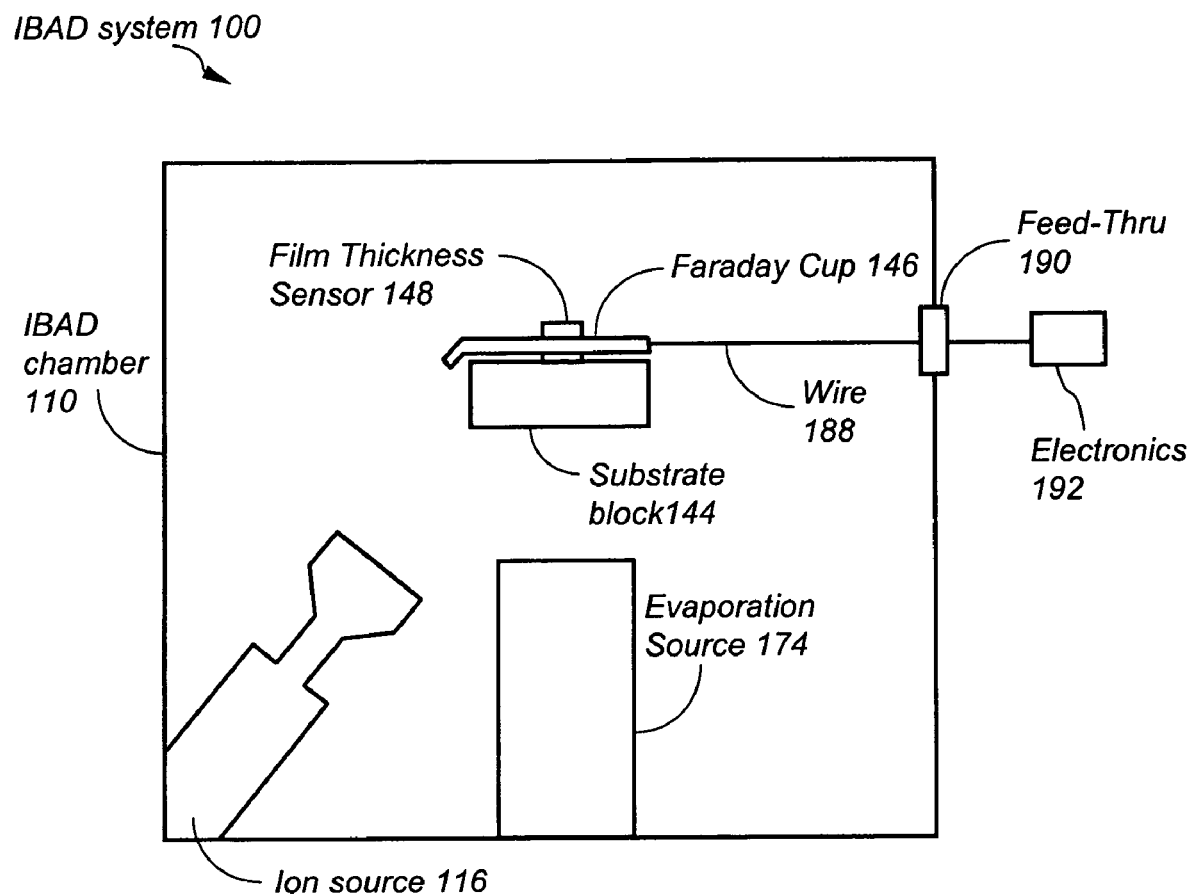
FIG. 1D is a cross-sectional view of the IBAD system taken along line B-B of FIG. 1B.

FIG. 1D illustrates a cross-sectional view of the IBAD system 100 taken along line B-B of FIG. 1B, that includes the IBAD chamber 110, the substrate block 144, the Faraday cup 146, the evaporation source 174, a wire 188, a feed-through 190, electronics 192 and the ion source 116.

The wire 188 is any commercially available, shielded wire capable of transmitting an electrical signal. The wire 188 may include a high-temperature resistant sheath such as Teflon.

The feed-through 190 is a commercially available feed-through that is capable of allowing a signal wire to pass through while still maintaining a vacuum seal.

The electronics 192 is a system of electronics that detects an ion charge and generates a corresponding electric signal.

The IBAD chamber 110 exists within the IBAD system 100. The substrate block 144 exists within the IBAD chamber 110. The film thickness sensor 148 is fixedly attached to a surface of the substrate block 144, such that the film thickness sensor 148 is not in a direct line of site of the ion source 116. Similarly, the Faraday cup 146 is fixedly attached to a surface of the substrate block 144 such that the Faraday cup 146 is aligned with the direction of propagation of ions from the RF ion source 116. The Faraday cup 146 is electrically coupled to the wire 188, which in turn pass through the feed-through 190 and is electrically coupled to the electronics 192. The feed-through 190 is functionally integrated into the IBAD chamber 110, such that a seal is maintained between the feed-through 190 and the IBAD chamber 110. The electronics 192 exist outside of the IBAD chamber 110.

The evaporation source 174 exists in IBAD chamber such that its top surface is horizontally aligned with the substrate block 144. The ion source 116 exists within the IBAD chamber 110 such that the ion source 116 is aligned with substrate block 144 to at an angle of 55 degrees from the tape normal.

Figure 1E:
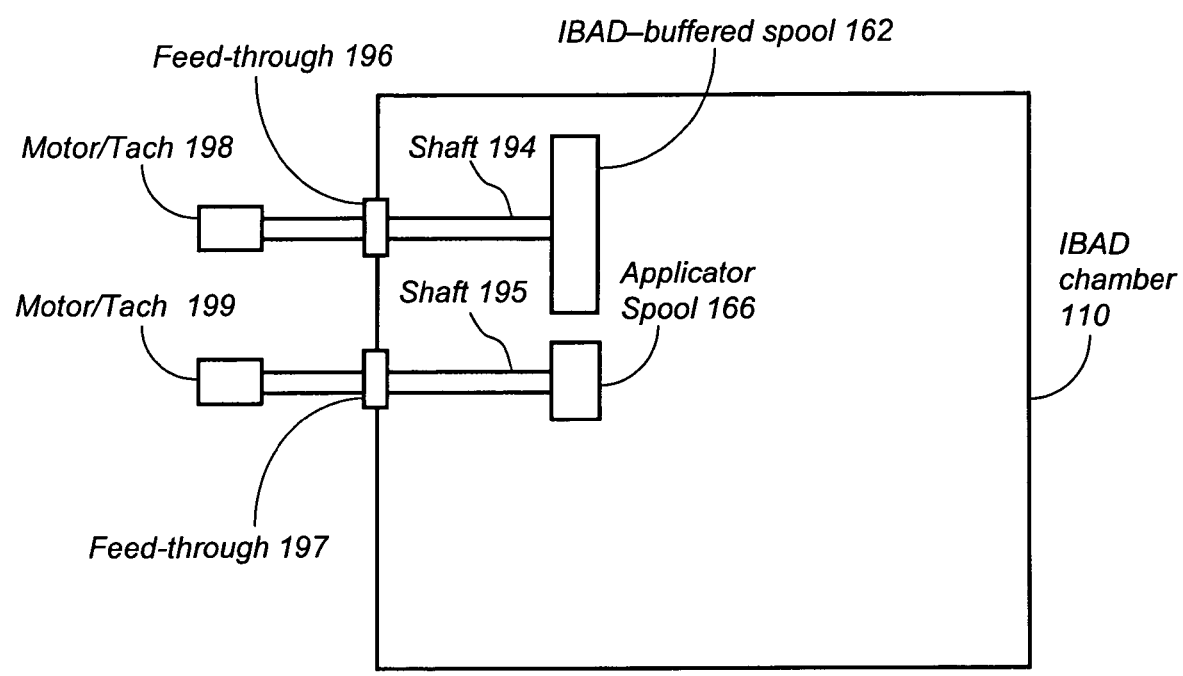
FIG. 1E is a cross-sectional view of the IBAD system taken along line C-C of FIG. 1B.

FIG. 1E illustrates a cross-sectional view of the IBAD system 100 taken along line C-C of FIG. 1B, that includes the IBAD chamber 110, the IBAD-buffered spool 162, the applicator spool 166, a shaft 194, a shaft 195, a feed-through 196, a feed-through 197, a motor/tach 198 and a motor/tach 199.

The shaft 194 and the shaft 195 are commercially available drive shafts capable of supporting the loads and stresses of the IBAD-buffered spool 162 and the applicator spool 166 respectively.

The feed-through 196 and the feed-through 197 are commercially available feed-throughs such as those produced by Ferrofluidics.

The motor/tach 198 and the motor/tach 199 are commercially available motor and tachometer systems capable of translating the tape 160 at speeds between 0.1 and 50 meters/hour at an accuracy within +/−1% of the linear speed.

The IBAD chamber 110 exists within the IBAD system 100. The IBAD-buffered spool 162 exists within the IBAD chamber 110. The IBAD-buffered spool 162 is functionally connected to the shaft 194, which passes through the feed-through 196 while still maintaining a vacuum seal. The shaft 194 is then functionally connected to the motor/tach 198. Similarly, the applicator spool 166 exists within the IBAD chamber 110. The applicator spool 166 is functionally connected to the shaft 195, which passes through the feed-through 197 while still maintaining a vacuum seal. The shaft 195 is then functionally connected to the motor/tach 199.

In operation, with regard to the IBAD system 100 as described in FIG. 1A, FIG. 1B, FIG. 1C, FIG. 1D and FIG. 1E, the sensor system 122 continuously monitors conditions and system parameters within the IBAD system 100. The sensor system 122 transmits the observed data as electric signals to the controller 118. The controller 118 then processes the electric signals received from the sensor system 122 using a set algorithm or program embedded in the controller's 118 memory to optimize the IBAD system 100 performance. The controller 118 then sends a separate and appropriate electric signal to the vacuum pump 112, the DC E-beam source 114, the ion source 116, the reel system 120, the sensor system 122 and the gas supply 124, thereby controlling the devices' performance appropriately.

The controller 118 commands the tank farm 126 to supply gases through the pipe 128, the pipe 130, and the pipe 132 to the IBAD chamber 110 or to the surface of the translating tape through orifices in substrate block 144. The controller 118 regulates and monitors gas flow through the pipe 128, the pipe 130, and the pipe 132 with the valve/flowmeter 134, the valve/flowmeter 136 and the valve/flowmeter 138, respectively. The coolant line 140 completes a supply and return coolant loop in which a coolant flows through the substrate block 144 in order to increase the heat transfer properties of the substrate block 144. Upon command from the controller 118, the sensor system 122 monitors the resonant frequency of the crystal in the film thickness sensor 148, and calculates the thickness of deposited film based on calibration measurements. Similarly, upon command from the controller 118, the temperature unit 152 monitors the temperature at the substrate block 144.

The Faraday cup 146 detects ions released from the ion source 116 at the substrate block 144, and forms an electric current in proportion to the amount of ions impinging upon the Faraday cup 146. This electric signal is transmitted via the wire 188, through the feed-through 190 to the electronics 192. The electronics 192 convert the electric current to a signal proportional to the amplitude of the electric current sensed by the Faraday cup 146 and transmit a new electric signal to the controller 118, as described in FIG. 1A. The film thickness sensor 148 detects the deposition rate at substrate block 144 and sends an electric signal to the controller 118 as described in FIG. 1A. Similarly, the detector 170 monitors the texture of the tape 160 and sends an electric signal to the controller 118 as described in FIG. 1A. From this, the controller 118 adjusts the power level of the DC E-beam source 114 and the ion source 116 to optimize deposition.

The motor/tach 184 rotates the shaft 176 that passes through the feed-through 180 and in turn rotates the MS spool 154. Similarly, the motor/tach 186 rotates the shaft 178 that passes through the feed-through 182 and in turn rotates the collector spool 156. The motor/tach 186 and the collector spool 156 rotate in such a manner that as the protective tape 158 unwinds from the MS spool 154, the protective tape 158 simultaneously winds onto the collector spool 156 at an equal rate. The controller 118 controls and monitors the motor/tach 184 and the motor/tach 186 as described in FIG. 1A.

The tape 160 then contacts the substrate block 144, at which point the tape 160 is bombarded by ions emitted from the ion source 116 as well exposed to vapor emitted from the evaporation source 174. The evaporation source 174 emits a vapor upon bombardment by electrons from the DC E-beam source 114. The tape 160 then contacts the strain gauge 168. The strain gauge 168 detects a force, which the tape 160 applies against it. The strain gauge 168 forms an electric signal proportional to the amplitude of the strain induced in it by the reel, and transmits this electric signal to the controller 118 as described in FIG. 1A.

The motor/tach 198 rotates the shaft 194 that passes through the feed-through 196 and in turn rotates the IBAD-buffered spool 162. Similarly, the motor/tach 199 rotates the shaft 195 that passes through the feed-through 197 and in turn rotates the applicator spool 166. The motor/tach 198 and the applicator spool 166 rotate in such a manner that as the protective tape 164 unwinds from the applicator spool 166, the protective tape 164 simultaneously winds onto the IBAD-buffered spool 162 at an equal rate. Similarly, the tape 160 winds onto the IBAD-buffered spool 162, such that for every wind of the tape 160 on the IBAD-buffered spool 162 exists a wind of the protective tape 164 on wound on top of it. The controller 118 controls and monitors the motor/tach 198 and the motor/tach 199 as described in FIG. 1A.

Upon command from the controller 118, the pressure gauge 150 monitors the pressure inside the IBAD chamber 110. The controller 118 then sends a control signal to the vacuum pump 112 and the valve 172 to increase or decrease the exhaust flow accordingly to maintain a desired chamber pressure.

Figure 2:
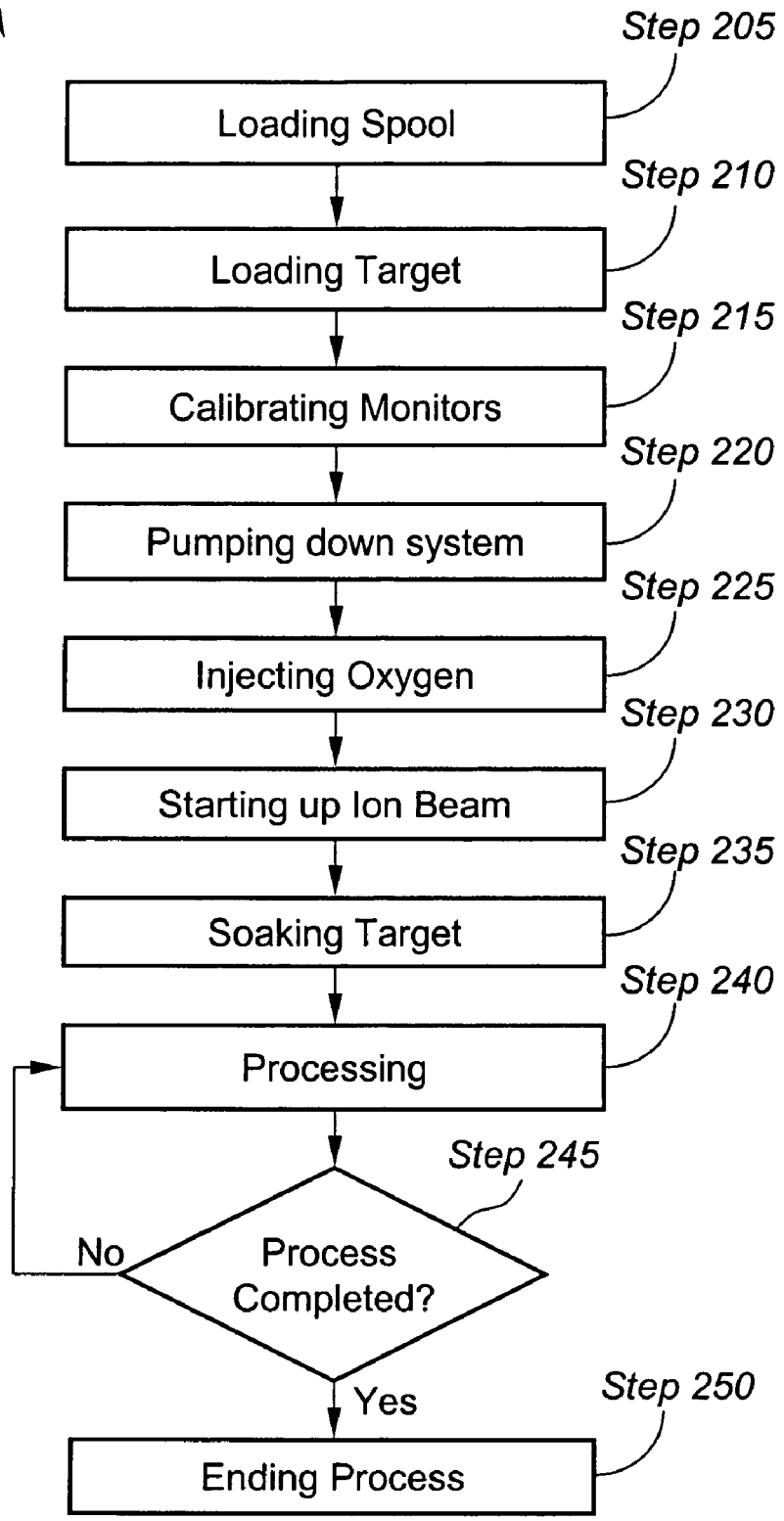
FIG. 2 illustrates a method of use of the IBAD system of the present invention.

FIG. 2 illustrates a method of use 200 of the IBAD system 100, in accordance with the invention, including the following steps:

Step 210: Loading Spool

In this step, the MS spool 154, on which the protective tape 158 and the tape 160 are wound, is loaded into the IBAD chamber 110. The tape 160 is then fed from the MS spool 154 to the IBAD-buffered spool 162.

Step 212: Loading Target

In this step, a material that is to be evaporated, such as YSZ or MgO, is loaded into the E-beam evaporator 174.

Step 214: Calibration Monitors

In this step, the sensor system 122 such as the Faraday cup 146, the pressure gauge 150, and the temperature unit 152 are calibrated.

Step 216: Pumping Down System

In this step, the controller 118 sends a command to the vacuum pump 112, in collaboration with the valve 172 and the pressure gauge 150 to pump down the IBAD chamber 110 to a pressure not greater than $10^{-5}$, preferably $10^{-7}$ Torr.

Step 218: Injecting Oxygen

In this step, upon command from the controller 118 oxygen is injected into the IBAD chamber 110 from the gas supply 124 via a pipe such as the pipe 128.

Step 220: Starting Ion Beam

In this step, the controller 118 commands the ion source 116 to turn on to a pre-determined power level and trajectory.

Step 222: Soaking Target

In this step, the DC E-beam source 114 bombards the target material contained within the evaporation source 174 with electrons for a given period of time. A typical period would be about one hour.

Step 224: Processing

A shutter (not shown) that covers a portion of the tape 160, which exists at the substrate block 144. A process is then initiated in which the tape 160 is fed through a deposition zone where the evaporation source 174 and the ion source 116 deposit a thin-film onto the tape 160 as per a pre-determined recipe that is stored in the memory of the controller 118.

Step 226: Process Completed

In this step, the controller 118, or a user, monitors and analyzes system the sensor system 118 and detects if the process is complete or not. If the process is completed, then proceed to the step 240. If the process is not completed, then return to the step 224.

Step 228: Ending Process

In this step, the controller 118 closes a shutter (not shown) and shuts down the IBAD system 100 including all control and feedback peripherals.

EXAMPLE 1

Example 1 demonstrates the effect of oxygen injected into the deposition chamber at different locations. Yttria-stabilized-zirconia (YSZ) was deposited by an ion beam assisted deposition process on 18 cm long polished inconel-625 substrates in a stationary mode.

Two experiments were conducted. In the first experiment, 20 sccm of oxygen was injected into the deposition chamber adjacent to the wall of the deposition chamber and away from the substrate. In the second experiment, 20 sccm of oxygen was injected into the deposition chamber through the orifices in the substrate cooling block. In this case, the oxygen was injected behind the back surface of the substrate as it was held in tension against the substrate block. All other deposition conditions were about the same in both experiments.

Figure 4:
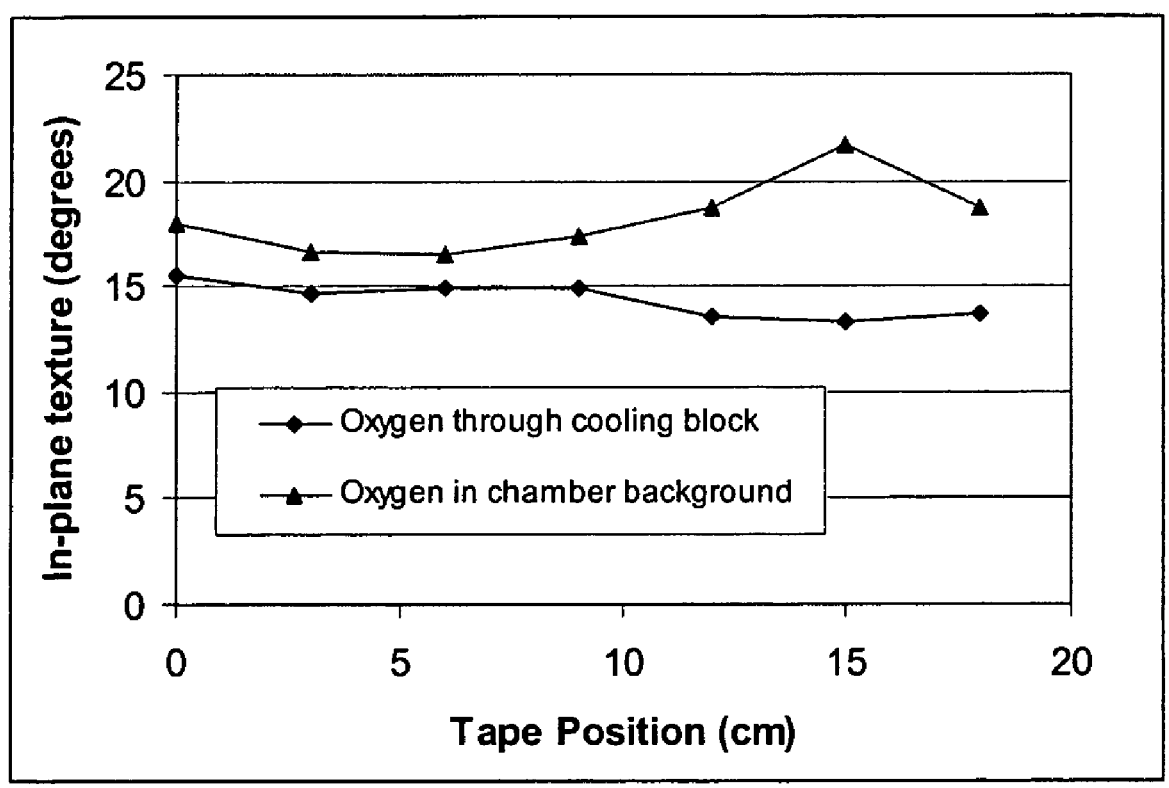
FIG. 4 is a graph of the in-plane texture of a coated substrate showing the difference when oxygen is injected.

FIG. 4 shows the in-plane texture of yttria-stabilized zirconia deposited under the 2 conditions.

As FIG. 4 demonstrates, the in-plane texture of the YSZ film deposited with the oxygen injected through the cooling block was less than that of the film deposited with the oxygen flowing the chamber background.

The average texture value of the YSZ film deposited with the oxygen flow through the cooling block was approximately 20% less [about 3 degrees] than that of the film deposited with the oxygen injected into the chamber background. Also, the uniformity of the texture of the YSZ film deposited with the oxygen flow through the cooling block was better, over the 18 cm tape length.

Uniform texture is important because the texture of a buffer film deposited on a moving tape has been found to be determined not by the average texture value of buffer film deposited on a stationary tape but rather, by the highest texture value. As such, one could expect that the texture of a YSZ film deposited with the oxygen flowing through the cooling block, in a moving mode, would be approximately, 15-16 degrees, which is the highest texture value measured in the film deposited in a stationary mode as shown in FIG. 4.

On the same reasoning, it was expected that the texture of a YSZ film deposited with the oxygen flowing in the background, in a moving mode, would be approximately, 21-22 degrees, which is the highest texture value measured in the film deposited in a stationary mode as shown in FIG. 1.

In such a case, the difference in the texture of a buffer film deposited in a moving mode with the oxygen flowing through the block would be about 40% [6 degrees] lower than the texture of a buffer film deposited in a moving mode with the oxygen injected into the chamber background.

Low in-plane texture values in buffer films are important since they greatly affect the critical current density of superconductor films that are grown epitaxially over them.

One possible explanation for the better in-plane texture when the oxygen is injected into the chamber through the orifices in the cooling block is the higher oxygen partially pressure in the vicinity of the substrate. Since the substrate is held in tension against the curved cooling block, the local pressure of the oxygen gas as it exits the orifices is expected to be higher than the oxygen partial pressure in the chamber background.

EXAMPLE 2

Another experiment was conducted with different amounts of oxygen injected into the chamber through the substrate block during deposition of YSZ films on stationary substrates.

Figure 5:
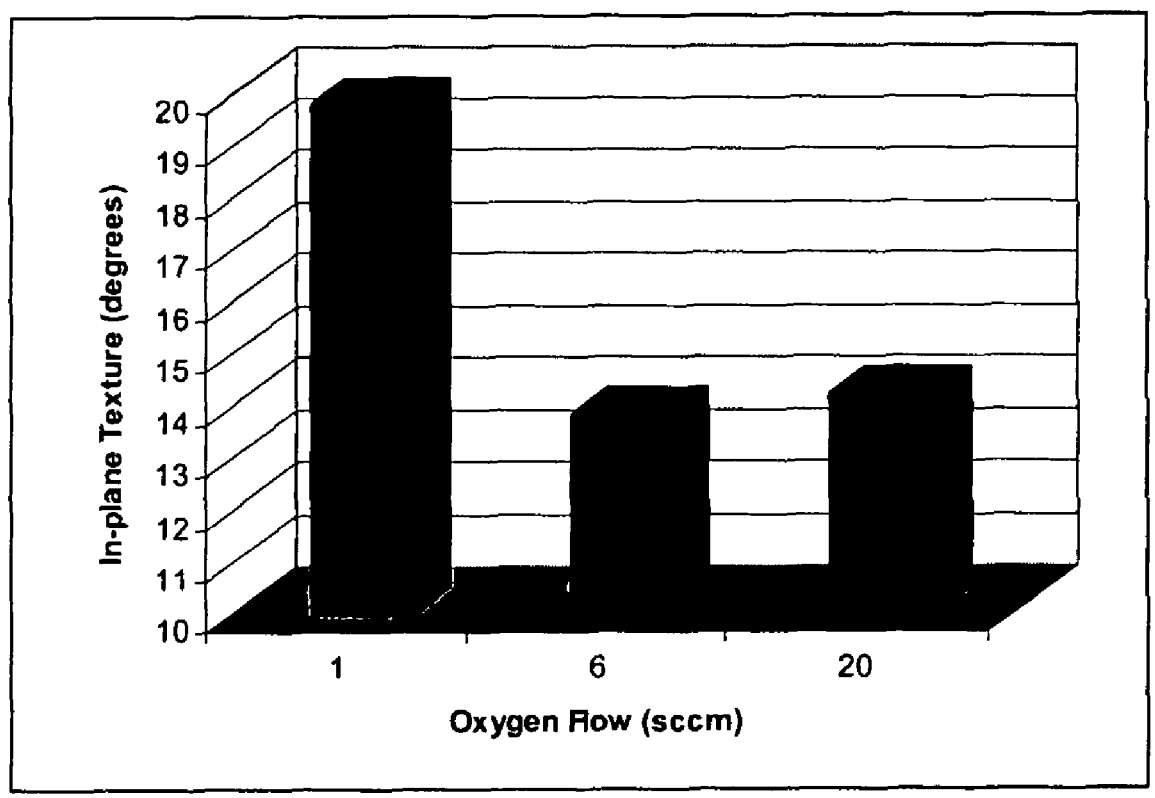
FIG. 5 is a graph of the in-plane texture of the coated substrate at various rates of oxygen flow.

FIG. 5 shows the in-plane texture of 3 films deposited with oxygen flows of 1, 6, and 20 sccm. The results obtained and reported in FIG. 2 demonstrate that the in-plane texture is unchanged from 20 to 6 sccm, but increases substantially in the film deposited at 1 sccm. These results are considered to confirm that the oxygen partial pressure in the vicinity of the substrate is an important factor in producing well-textured YSZ films.

The invention claimed is:

1. A process for continuous deposition of a coating of an HTS tape, comprising:
    loading a substrate into a deposition chamber;
    translating the substrate through the deposition chamber along a first surface of a substrate block, the substrate block having a gas inlet for feeding gas into a manifold, the manifold distributing gas flow to a plurality of gas channels, including first and second gas channels, extending through the substrate block along a portion thereof and terminating at the first surface as respective openings at positions spaced apart from each other along the first surface, the substrate block further having an internal coolant channel located between the first and second gas channels;
    injecting an oxygen containing gas from the inlet, through the manifold, and through the plurality of gas channels of the substrate block and onto the substrate; and
    depositing a coating material from a deposition source on the substrate as the substrate translates along the substrate block to thereby form the coating, the coating being a buffer layer over which an HTS layer is formed, the buffer layer having a biaxial texture;
    impinging an ion beam from an ion source on the substrate during depositing;
    monitoring a thickness of the coating, a number of ions from the ion beam impinging on the substrate, and the biaxial texture of the coating during depositing;
    during deposition adjusting the power level of at least one of the ion source and the deposition source based on the monitoring of biaxial texture,
    wherein injecting the gas directly through the substrate block improves the biaxial texture of the buffer layer as compared to supplying gas indirectly into the deposition chamber.

2. The process of claim 1, wherein the buffer layer has an in-plane texture of not greater than 20 degrees.

3. The process of claim 2, wherein the buffer layer has an in-plane texture of not greater than 15 degrees.

4. The process of claim 3, wherein the buffer layer has an in-plane texture of not greater than 14 degrees.

5. The process of claim 1, wherein the coating material is generated by vaporizing a material source in the deposition chamber, vaporization being carried out by energizing an energy source.

6. The process of claim 5, wherein the energy source is selected from the group consisting of electron beam energy, ion beam energy, and magnetron energy.

7. The process of claim 1, wherein the substrate is translated through the deposition chamber by a reel-to-reel system.

8. The process of claim 1, further comprising passing a coolant through the coolant channel.

9. The process of claim 1, wherein the substrate block and the substrate are in a heat transfer relationship, the substrate block being maintained at a temperature below 50° C.

10. The process of claim 1, wherein the gas channels terminate at nozzles, and wherein the gas is flowed through the nozzles such that the gas flows onto a backside of the substrate.

11. The process of claim 1, wherein the tape is translated through the deposition chamber at a speed within a range of about 0.4 to 300 meters/hour.

12. The process of claim 1, wherein the coating material is selected from the group consisting of MgO and YSZ.

13. The process of claim 1, wherein the coating material is deposited with the assist of an ion beam.

14. The process of claim 1, wherein the substrate block has multiple rows of gas channels.

15. The process of claim 1, wherein the substrate comprises a nickel alloy.

16. The process of claim 1, wherein the openings have an inner diameter between about 0.05 inches and about 0.25 inches.

17. The process of claim 16, wherein the inner diameter is between about 0.075 inches and about 0.175 inches.

18. The process of claim 1, wherein the first surface of a substrate block has a curved contour with a radius of curvature of between 2 meters and 25 meters.

19. The process of claim 1, wherein the texture of the buffer layer is improved by at least 3 degrees.

20. A process for continuous deposition of a coating of an HTS tape, comprising:

loading a substrate into a deposition chamber;

translating the substrate through the deposition chamber along a substrate block, the substrate block having a gas inlet for feeding gas into a manifold, the manifold distributing gas flow to a plurality of gas channels, including first and second gas channels, extending through the substrate block along a portion thereof, the gas channels having a length extending from the manifold to the first surface of the substrate block and a substantially straight centerline extending along substantially the entire length, being hollow and open along the entirety of the length, and terminating at the first surface at positions spaced apart from each other along the first surface, the substrate block further having an internal coolant channel located between the first and second gas channels;

depositing a coating material from a deposition source on the substrate as the substrate translates along the substrate block to thereby form the coating, the coating being a buffer layer over which an HTS layer is formed, the buffer layer having a biaxial texture;

impinging an ion beam from an ion source on the substrate during depositing;

injecting an oxygen containing gas through the gas channels of the substrate block and onto the substrate during depositing to reduce an average texture of the buffer layer;

monitoring the biaxial texture of the coating, a number of ions from the ion beam impinging on the substrate, and a thickness of the coating during depositing; and during deposition, adjusting the power level of at least one of the ion source and the deposition source based on the monitoring of biaxial texture, and regulating a flow of the oxygen containing gas.

* * * * *